United States Patent
Lapin et al.

(10) Patent No.: US 7,683,737 B2
(45) Date of Patent: Mar. 23, 2010

(54) BROADBAND PHASE SHIFTER

(75) Inventors: Mikhail V. Lapin, Espoo (FI); Igor S. Nefedov, Espoo (FI); Stanislav I. Malovski, St. Petersburg (RU); Sergei A. Tretyakov, Espoo (FI)

(73) Assignee: Nokia Corporation, Espoo (FI)

( * ) Notice: Subject to any disclaimer, the term of this patent is extended or adjusted under 35 U.S.C. 154(b) by 235 days.

(21) Appl. No.: 11/606,911

(22) Filed: Dec. 1, 2006

(65) Prior Publication Data
US 2007/0146097 A1    Jun. 28, 2007

(30) Foreign Application Priority Data
Dec. 2, 2005   (FI) .................................. 20055642

(51) Int. Cl.
*H01P 1/18* (2006.01)
(52) U.S. Cl. ...................................... 333/156; 333/164
(58) Field of Classification Search ................ 333/156, 333/164, 138–140; 342/368
See application file for complete search history.

(56) References Cited

U.S. PATENT DOCUMENTS

| | | | | |
|---|---|---|---|---|
| 4,992,761 A | * | 2/1991 | Seely et al. ................. | 333/118 |
| H954 H | * | 8/1991 | Lang et al. .................. | 333/164 |
| 5,039,873 A | * | 8/1991 | Sasaki ........................ | 327/237 |

OTHER PUBLICATIONS

Marco A. Antoniades, et al., "Compact Linear Lead/Lag Metamaterial Phase Shifters for Broadband Applications", IEEE Antennas and Wireless Propagation Letters, vol. 2, 2003, pp. 103-106.

* cited by examiner

*Primary Examiner*—James Cho
(74) *Attorney, Agent, or Firm*—Squire, Sanders & Dempsey L.L.P.

(57) ABSTRACT

A phase shifting method and a phase shifter are provided. The phase shifter comprises a first (200) and a second (202) transmission line structure in parallel, the structures having a common input, each structure comprising cascaded forward and backward transmission lines and the same number of components. The component values of the second structure are equal to the component values of the first structure multiplied by a given proportionality constant.

23 Claims, 3 Drawing Sheets

BROADBAND PHASE SHIFTER

FIELD

The invention relates to phase shifters, especially phase shifters having cascaded forward and backward transmission lines.

BACKGROUND

In modern electronics, phase shifters are used in many applications. Especially in communication electronics phase shifters are used to modify transmitted or received signals. In wireless communication, phase shifters are used in phasing the input signals of antenna arrays so that different transmission beams may be formed.

In general, a phase shifter receives as an input an electric signal and produces at the output two signals which are shifted with respect to each other by a predetermined phase angle.

In many applications, a constant phase shift over a wide frequency band is desired. This applies especially to communication applications. Recently, solutions where combined backward and forward transmission lines are used have been suggested (M. A. Antoniades and G. V. Eleftheriades. Compact Linear Lead/Lag Metamaterial Phase Shifters for Broadband Applications. IEEE Antenn. Wireless Propag. Lett., 2:103, 2003).

Solutions where a phase shift is produced by a simple forward transmission line show a linear dependence on frequency. A simple backward transmission line is generally even more dispersive in frequency domain. In proposed solutions where combined forward-backward transmission lines are used, frequency dependence has reduced remarkably. However, the solutions are restricted to phase shifts around 180°, and cannot be used for creating arbitrary phase shifts.

BRIEF DESCRIPTION OD THE INVENTION

An object of the invention is to provide a phase shifter with improved broadband properties. According to an aspect of the invention, there is provided a phase shifter. The phase shifter comprises a first and a second transmission line structure in parallel, the structures having a common input, each structure comprising cascaded forward and backward transmission lines and the same number of components, the component values of the second structure being equal to the component values of the first structure multiplied by a given proportionality constant.

According to another aspect of the invention, there is provided a phase shifter which comprises two or more phase shifter stages each stage comprising a first and a second transmission line structure in parallel, the structures of the first stage having a common input, and in each stage, each structure comprising cascaded forward and backward transmission lines and the same number of components, the component values of the second structure being equal to the component values of the first structure multiplied by a given proportionality constant.

According to another aspect of the invention, there is provided a phase shifting method comprising: supplying an input signal to a first and a second transmission line structure which are connected in parallel, each structure comprising cascaded forward and backward transmission lines and the same number of components, the component values of the second structure being equal to the component values of the first structure multiplied by a given proportionality constant, and obtaining the desired phase shift as the phase difference of the output signals of the structures.

According to another aspect of the invention, there is provided an antenna array arrangement, the antenna array arrangement comprising a phase shifter comprising a first and a second transmission line structure in parallel, the structures having a common input, each structure comprising cascaded forward and backward transmission lines and the same number of components, the component values of the second structure being equal to the component values of the first structure multiplied by a given proportionality constant.

According to another aspect of the invention, there is provided a base station of a telecommunication system, the base station comprising a phase shifter connected to an antenna array, the phase shifter comprising a first and a second transmission line structure in parallel, the structures having a common input, each structure comprising cascaded forward and backward transmission lines and the same number of components, the component values of the second structure being equal to the component values of the first structure multiplied by a given proportionality constant.

According to yet another aspect of the invention, there is provided a phase shifter comprising an input and two outputs for providing output signals in the two outputs, the two output signals being phase shifted relative to each other by a given angle. The phase shifter comprises first and second means for shifting the phase of a signal at the input of the phase shifter, the means being connected in parallel and comprising a combined forward and backward transmission line structure, each structure comprising the same number of components, the component values of the second structure being equal to the component values of the first structure multiplied by a given proportionality constant.

The embodiments of the invention provide several advantages. The proposed solution has obvious advantages of high frequency stability concerning the produced phase shift and the input impedance of the device. It can be realized with simple electronic components, like capacitors, inductors and microstrip lines, and is therefore suitable for a relatively high power while devoid of nonlinear effects. It is possible to build a device where phase shift can be switched with a small step of few degrees in a wide phase range without a significant change in performance. This may be achieved with an arrangement where several phase shifting stages with different shifting properties are connected in cascade.

Using a phase shifter realized according to embodiments of the invention, it is possible to obtain an arbitrary value of the phase shift, and to retain this value extremely stable in a wide frequency range.

LIST OF DRAWINGS

In the following, the invention will be described in greater detail with reference to the embodiments and the accompanying drawings, in which FIG. 1A shows an example of a conventional prior art phase shifter;

DESCRIPTION OF EMBODIMENTS

Figure 1A:
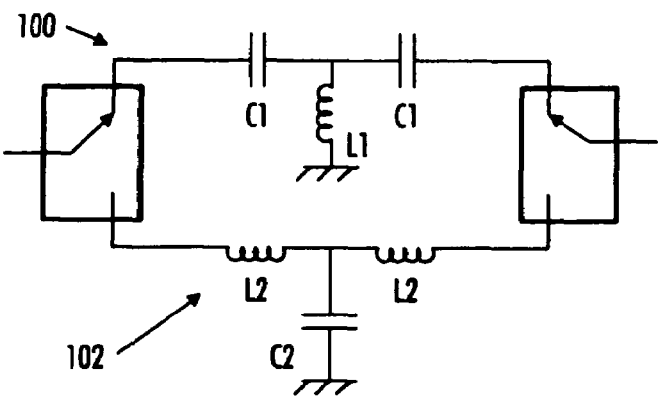
FIG. 1B illustrates properties of a conventional prior art phase shifter.
Figure 1B:
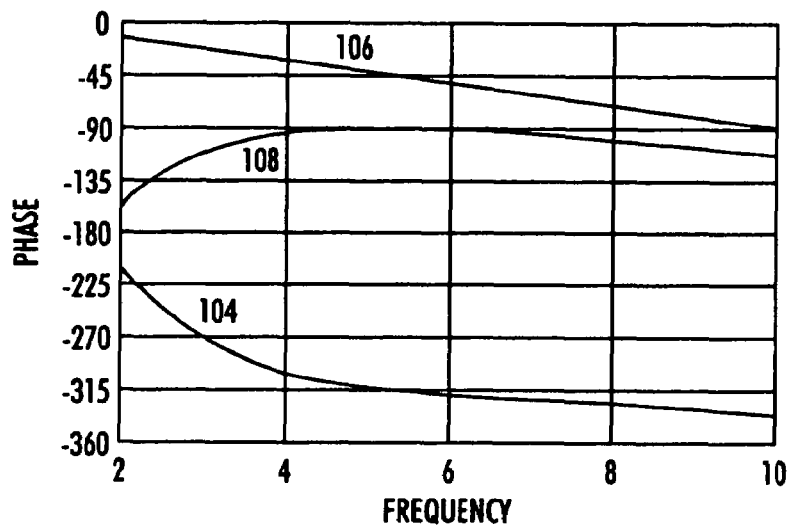

With reference to FIG. 1A, examine an example of a conventional prior art phase shifter realized with a high-pass/low-pass structure. The phase shifter comprises two lines 100, 102. The first line 100 is a high-pass filter and the second line 102 is a low-pass filter. In the conventional phase shifter, the two lines have different frequency dispersion as FIG. 1B illustrates. On the horizontal axis is frequency in GHz and on the vertical axis is phase in degrees. Line 104 illustrates a high-pass line, line 106 illustrates a low-pass line and line 108 illustrates phase shift. The phase shift is nearly constant only on a relatively narrow frequency range and the performance of the circuit is not satisfactory.

Figure 2:
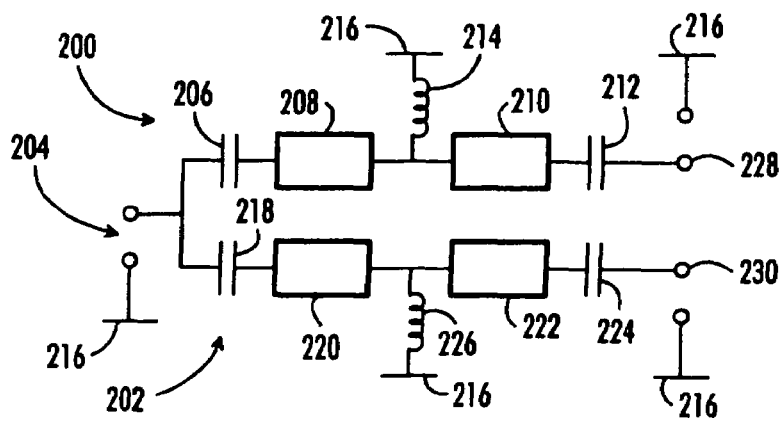
FIG. 2 illustrates an example of a phase shifter of an embodiment of the invention.

FIG. 2 illustrates an example of a phase shifter of an embodiment of the invention. The phase shifter comprises a first and a second transmission line structure 200, 202 in parallel. The structures have a common input 204. Each structure comprises cascaded forward and backward transmission lines and the same number of components. In this example of a phase shifter, the first structure 200 comprises a capacitor 206 having a value of $2C_1$, two transmission lines 208, 210 of length $d_1$; and a second capacitor 212 having a value of $2C_1$ connected in series. An inductor 214 having a value of $L_1$ is connected between the midpoint of the two transmission lines 208, 210 and a reference potential 216, for example the ground potential. The second structure 202 comprises a capacitor 218 having a value of $2C_2$, two transmission lines 220, 222 of length $d_2$ and a second capacitor 224 having a value of $2C_2$ connected in series. An inductor 226 having a value of $L_2$ is connected between the midpoint of the two transmission lines 220, 222 and a reference potential 216, for example the ground potential. The first structure has an output 228 and the second structure has an output 230.

The capacitors and inductors may be realised with lumped components. The components may be commercial lumped components or they may be realized with interdigital or slit capacitors and short or meander vias to the ground for inductors, for example. The transmission line segments may be realised with a microstrip lines or with lumped components (series inductors and capacitor to ground, for example).

In an embodiment, the component values of the second structure 202 are equal to the component values of the first structure 200 multiplied with a given proportionality constant $\xi$. Thus, $C_2=\xi C_1$, $L_2=\xi L_1$, and $d_2=\xi d_1$.

The structure of a phase shifter of FIG. 2 may be called a Double-Line Phase Shifter, DLPS. While the phase shifts at the output 228, 230 of each structure with respect to the common input 204 vary in frequency, the phase difference between the two outputs 228, 230 remains nearly the same in a wide frequency range.

Figure 3A:
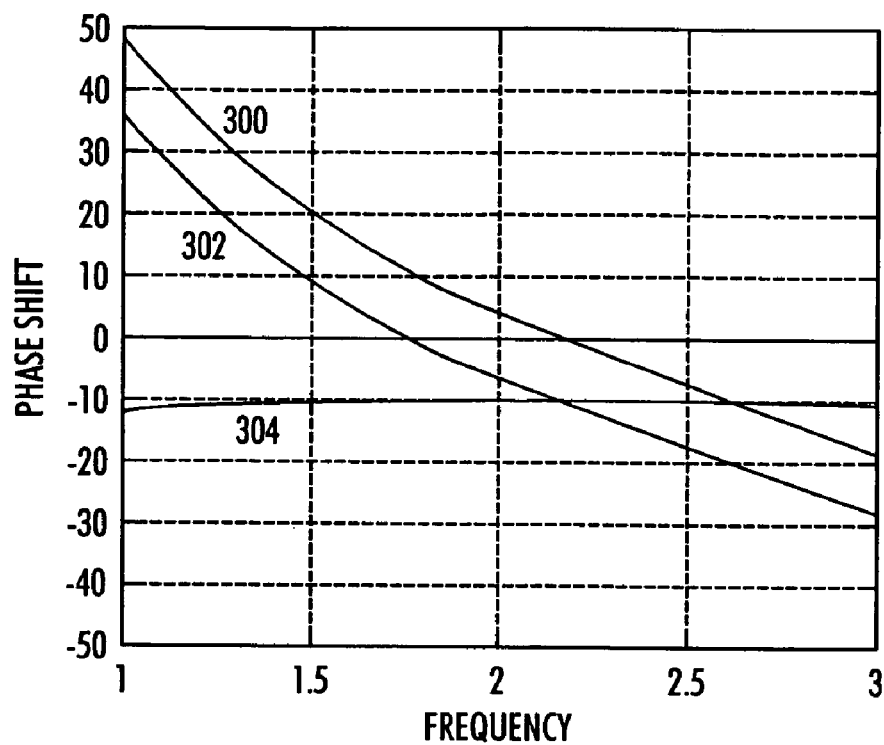
FIG. 3A illustrates frequency dependence of phase shifts of a phase shifter of FIG. 2.

FIG. 3A illustrates an example of an embodiment. FIG. 3A shows frequency dependence of the phase shifts produced by each structure as well as the resulting phase difference. In this example, the component values are as follows: (here transmission line lengths $d_1$, $d_2$ do not take substrate into account):

$C_1$=3 pF, $C_2$=3.6 pF
$L_1$=7.6 nH, $L_2$=9.1 nH
$d_1$=5.2 mm, $d_2$=6.2 mm

Here, the given proportionality constant $\xi$ is thus 1.2. The phase shift produced by the phase shifter of FIG. 3A is 10 degrees. On the horizontal axis is frequency in GHz and on the vertical axis is phase in degrees. Line 300 illustrates the phase shift of the signal at the output 228 of the upper structure with respect to the reference potential 216, line 302 illustrates the phase shift of the signal at the output 230 of the lower structure with respect to the reference potential 216 and line 304 illustrates the phase difference of the signals at the two outputs.

Figure 3B:
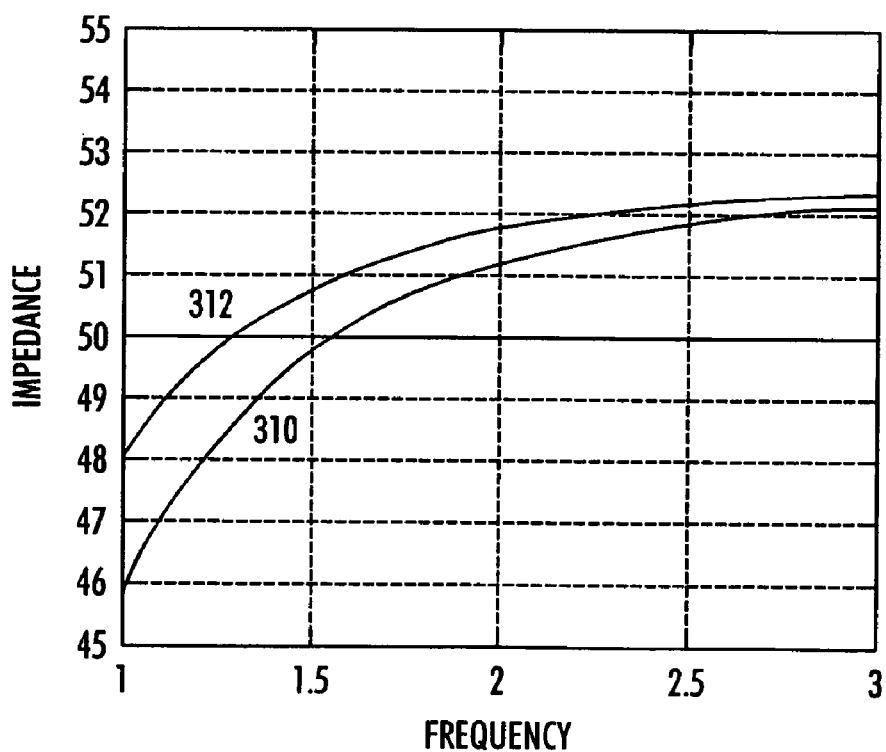
FIG. 3B illustrates input impedance characteristics of a phase shifter of FIG. 2.

FIG. 3B illustrates input impedance of the phase shifter having the component values described above. On the horizontal axis is frequency in GHz and on the vertical axis is input impedance in Ohms. Line 310 illustrates the input impedance of the upper structure and line 312 illustrates the input impedance of the lower structure.

FIG. 3A shows that the dispersion curves 300, 302 for the two structures are similar. This is because both structures have the same nature and therefore very similar frequency dispersion. Accordingly, the phase difference 304 between them undergoes only a slight variation in a certain frequency range. The flattest region of the curve 304 corresponds to the frequencies where the phase shifts of the two lines 300, 302 are approximately opposite, so that one line is in the forward mode while the other one is in the backward mode. The smaller the phase difference, the smaller the deviation is. It can also be shown by analysing the impedance characteristics of the structures, that in the particular example of FIGS. 3A and 3B, the phase deviation of the phase shifter is less than 0.1 degrees while impedance deviation is less than 1 Ohm. In an embodiment, the impedance characteristics are good because L and C values are matched to transmission line impedance.

In an embodiment, the characteristics of the two structures are strictly proportional and the transmission line sections and lumped components are matched to each other: $Z_0=\sqrt{L/C}$, where $Z_0$ is the wave impedance of each transmission line section, and L and C are inductance and capacitance of the lumped components.

In an embodiment, a slight mismatch in the characteristics are acceptable, provided that in the range of operating frequencies each structure operates completely in either forward or backward regime (because a band gap will appear when the matching condition is not fulfilled). This can be illustrated in FIG. 3A as follows: the curves 300 and 302 should not cross zero within the desired operating range. However, the stronger the mismatch is, the stronger the impedance varies with frequency, leading to subdued performance.

Figure 4:
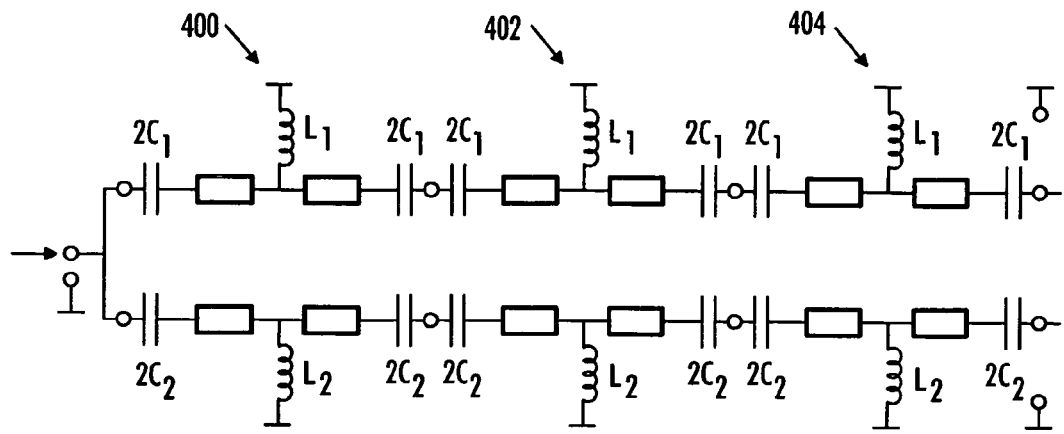
FIGS. 4 and 5 illustrate examples of multistage phase shifters.

In an embodiment, with the phase shifts up to 45 degrees per one phase shifter unit of FIG. 2, it is possible to achieve less than 1° deviation within 1920 to 2170 MHz range, with the impedance stability of a few Ohm deviation from 50 Ohm (as FIG. 4 shows).

The input impedance of the phase shifter may be chosen by varying the L/C ratio and transmission line parameters. The frequency area where the phase shift is most constant may be adjusted with L*C alteration.

In an embodiment, frequency range and impedance can be adjusted independently. Depending on environment, the impedance may be set to any required value without a significant change in performance. The impedance is not restricted to 50 Ohms.

In an embodiment, a phase shifter is realised using two or more phase shifter stages of FIG. 2 connected in series. FIG. 4 illustrates an example where three phase shifters 400, 402, 404 of FIG. 2 are connected in series. With a multistage phase shifter an arbitrary phase shift may be achieved.

In an embodiment, at least one stage of the multistage phase shifter has different component values than the other stages. For example, if a 14-stage phase shifter is utilised where nine stages produce a 3-degree phase shift each and five stages produce a 30-degree phase shift each, the resulting total phase shift can be varied between 0 to 180 degrees with a 3-degree step.

In an embodiment, all stages of the multistage phase shifter are identical. The performance of the phase shifter may be improved by cascading stages with a small phase shift instead of using a single stage with a large phase shift. For example, the best characteristics for an 80 to 100 degree phase shifter are achieved with three stages. Even with multiple stages the phase shifter is simple to realise: a three-stage phase shifter requires only six inductors and twelve capacitors.

The use of a multistage phase shifter may thus server two purposes: optimising the performance by using identical stages or enabling switchable configuration by using different stages.

Figure 5:
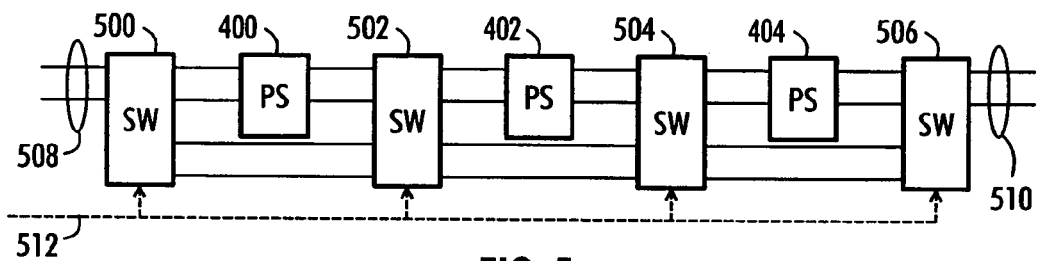

FIG. 5 illustrates an embodiment where the phase shifter comprises three stages 400, 402, 404 and a switching arrangement comprising four switches 500, 502, 504 and 506. With the switches an arbitrary range of phase shifts with a relatively small discrete step may be achieved by excluding one or more stages from the signal path between the input 508 and output 510. The signal at the input 508 may be connected to any stage 400, 402, 404 of the phase shifter, and any stage may be bypassed.

In an embodiment, the switches are controlled by an external control signal 512.

Figure 6:
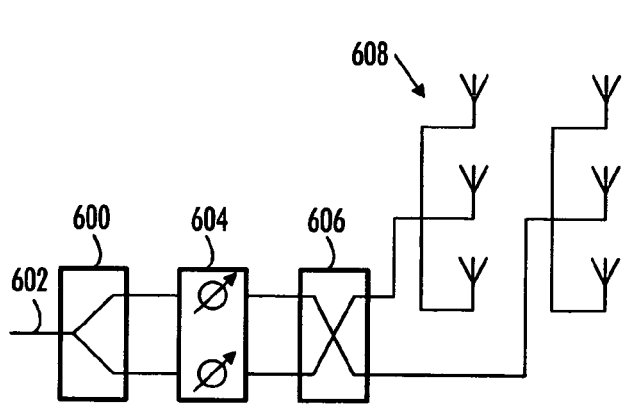
FIG. 6 illustrates an antenna array arrangement.

FIG. 6 illustrates an antenna array arrangement in a transmitter or a receiver. The arrangement comprises a power divider 600 which divides the input signal 602 at the input of the divider into two. The outputs of the divider 600 are connected to a phase shifter 604 which may be realised as a single-stage or a multistage phase shifter. The phase divider 604 phases the signals coming from the power divider 600. The output signals of the phase shifter 604 are connected to a 90-degree hybrid 606, from which the signals are taken to an antenna array 608. The antenna array arrangement may be used in a base station or a mobile station of a wireless communication system, for example.

Figure 7:
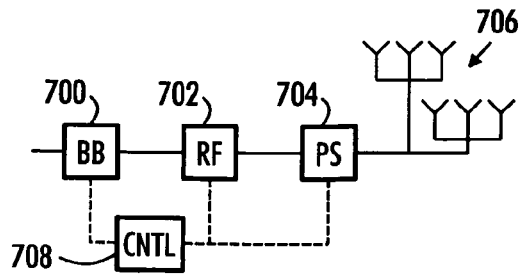
FIG. 7 illustrates a base station of a telecommunication system.

FIG. 7 illustrates a base station of a telecommunication system. The base station comprises a base band unit 700 and a radio frequency unit 702 connected to the base band unit 700. The output signal of the radio frequency unit 702 is taken to a phase shifter 704, from which the signal is taken to an antenna array 706. The base station further comprises a controller 708, which controls the operation of the other units of the base station. In an embodiment, the phase shifter 704 of the base station is a multistage phase shifter of the type described in connection with FIG. 5. The controller 708 may be configured to control the operation of the switches of the multistage phase shifter and thus control the phase shift produced by the phase shifter 704. The phase shifter may be used to phase the signal to be transmitted or the signal which has been received using the antenna array 706.

Even though the invention has been described above with reference to an example according to the accompanying drawings, it is clear that the invention is not restricted thereto but it can be modified in several ways within the scope of the appended claims.

The invention claimed is:

1. An apparatus, comprising:
a first and a second transmission line structure in parallel, the first and second transmission line structures having a common input, each of the first and second transmission line structures comprising cascaded forward and backward transmission lines and comprising at least two components on each of the first and second transmission line structures, such that each of the first and second transmission line structures comprises an equal number of the at least two components,
wherein each of the at least two components on each of the first and second transmission line structures comprise respective component values, and
wherein the component values of each of the at least two components on the second transmission line structure multiplied by a proportionality constant are equal to each of the at least two corresponding component values of the first transmission line structure.

2. The apparatus of claim 1, wherein the first and second transmission line structures comprise lumped capacitors, lumped inductors and transmission line segments.

3. The apparatus of claim 2, wherein the components of the first and the second transmission line structures have proportional values: $C_2=\xi C_1$, $L_2=\xi L_1$, $d_2=\xi d_1$, where $\xi$ is a predetermined proportionality constant, $C_1$ and $C_2$ are capacitances of the lumped capacitors, $L_1$ and $L_2$ are inductances of the lumped inductors, and $d_1$ and $d_2$ are the lengths of transmission line segments of the first and second transmission line structures.

4. The apparatus of claim 1, wherein the first and second transmission line structures comprise a forward transmission line and a backward transmission line in cascade.

5. The apparatus of claim 2, wherein the first and second transmission line structures are realized with microstrip lines.

6. The apparatus of claim 2, wherein the first and second transmission line structures are realized with lumped components.

7. The apparatus of claim 1, wherein the apparatus comprises a portable electronic device.

8. The apparatus of claim 1, wherein the apparatus comprises a base station.

9. The apparatus of claim 1, wherein the apparatus comprises a mobile station.

10. An apparatus, comprising:
two or more phase shifter stages, each of the two or more phase shifter stages comprising a first and second transmission line structures in parallel, the first and second transmission line structures of a first stage having a common input, and in each of the two or more phase shifter stages, each of the first and second transmission line structures comprising cascaded forward and backward transmission lines and a same number of components, the component values of the second transmission line structure being equal to the component values of the corresponding components of the first transmission line structure multiplied by a given proportionality constant.

11. The apparatus of claim 10, further comprising a switching arrangement to connect an input signal to any of the two or more phase shifter stages of the phase shifter.

12. The apparatus of claim 10, further comprising an input and an output, the two or more phase shifter stages connected between the input and output comprising a signal path, and the phase shifter comprising a switching arrangement to exclude one or more of the two or more phase shifter stages from the signal path.

13. The apparatus of claim 10, comprising at least one of the two or more phase shifter stages having different component values than other of the two or more phase shifter stages.

14. A method, comprising
supplying an input signal to a first and a second transmission line structures which are connected in parallel, each of the first and second transmission line structures comprising cascaded forward and backward transmission lines and comprising at least two components on each of the first and second transmission line structures, such that each of the first and second transmission line structures comprises an equal number of the at least two components, wherein each of the at least two components on each of the first and second transmission line structures comprise respective component values, and wherein the component values of each of the at least two components on the second transmission line structure multiplied by a proportionality constant are equal to each of the at least two corresponding component values of the first transmission line structure; and obtaining a desired phase shift as a phase difference of output signals of the first and second transmission line structures.

15. The method of claim 14, further comprising:
selecting a frequency range of a phase shifter by adjusting value L*C, where C is related to capacitances of lumped capacitors of the phase shifter and L is related to inductances of lumped inductors of the desired phase shift.

16. The method of claim 14, further comprising:
selecting an impedance of a phase shifter by adjusting value L/C, where C is related to capacitances of lumped capacitors of the phase shifter and L is related to inductances of lumped inductors of the desired phase shift.

17. The method of claim 14, further comprising:
adjusting a frequency range and an impedance of the desired phase shift independently of each other.

18. An apparatus, comprising:
an antenna array arrangement, the antenna array arrangement comprising a phase shifter comprising a first and second transmission line structures in parallel, the first and second transmission line structures having a common input, each of the first and second transmission line structures comprising cascaded forward and backward transmission lines and comprising at least two components on each of the first and second transmission line structures, such that each of the first and second transmission line structures comprises an equal number of the at least two components, wherein each of the at least two components on each of the first and second transmission line structures comprise respective component values, and wherein the component values of each of the at least two components on the second transmission line structure multiplied by a proportionality constant are equal to each of the at least two corresponding component values of the first transmission line structure.

19. The apparatus of claim 18, wherein the first and second transmission line structures comprise lumped capacitors, lumped inductors and transmission line segments.

20. The apparatus of claim 18, wherein the first and second transmission line structures comprise a forward transmission line and a backward transmission line in cascade.

21. An apparatus, comprising:
a phase shifter connected to an antenna array, the phase shifter comprising a first and second transmission line structures in parallel, the first and second transmission line structures having a common input, each of the first and second transmission line structures comprising cascaded forward and backward transmission lines and comprising at least two components on each of the first and second transmission line structures, such that each of the first and second transmission line structures comprises an equal number of the at least two components, wherein each of the at least two components on each of the first and second transmission line structures comprise respective component values, and wherein the component values of each of the at least two components on the second transmission line structure multiplied by a proportionality constant are equal to each of the at least two corresponding component values of the first transmission line structure.

22. The apparatus of claim 21, further comprising a controller configured to control a phase shift produced by the phase shifter.

23. An apparatus, comprising:
providing means comprising an input and two outputs for providing output signals in the two outputs, the output signals being phase shifted relative to each other by a given angle; and first and second shifting means for shifting a phase of a signal at the input of the phase shifter, the first and second shifting means comprising a first and a second transmission line structures being connected in parallel and each of the first and second transmission line structures comprising a combined forward and backward transmission line structure, each of the first and second transmission line structures comprising an equal number of at least two components, the component values of each of the at least two components of the second transmission line structure multiplied by a given proportionality constant are equal to the component values of the corresponding components of the first transmission line structure.

* * * * *